(12) United States Patent
Kuramachi

(10) Patent No.: US 6,487,227 B1
(45) Date of Patent: Nov. 26, 2002

(54) SEMICONDUCTOR LASER

(75) Inventor: Teruhiko Kuramachi, Kaisei-machi (JP)

(73) Assignee: Fuji Photo Film Co., Ltd., Kanagawa-ken (JP)

( * ) Notice: Subject to any disclaimer, the term of this patent is extended or adjusted under 35 U.S.C. 154(b) by 57 days.

(21) Appl. No.: 09/690,743

(22) Filed: Oct. 18, 2000

(30) Foreign Application Priority Data

Oct. 18, 1999 (JP) .......................................... 11-295260

(51) Int. Cl.$^7$ ................................................. H01S 5/00
(52) U.S. Cl. ...................................................... 372/49
(58) Field of Search ............................... 372/49, 45, 46

(56) References Cited

U.S. PATENT DOCUMENTS 5,812,580 A * 9/1998 Nabiev et al. ................. 372/49
6,330,264 B1 * 12/2001 Kussmaul ..................... 372/49

FOREIGN PATENT DOCUMENTS

JP 6-112679 4/1994 ............ H05K/7/20

OTHER PUBLICATIONS

Patent Abstract of Japan 06–112679 Apr. 22, 1994.

\* cited by examiner

*Primary Examiner*—Quyen Leung

(74) *Attorney, Agent, or Firm*—Sughrue Mion, PLLC

(57) ABSTRACT

Disclosed herein is a semiconductor laser having a first transparent dielectric film formed on at least either a front or rear facet through which oscillating light passes, a second transparent dielectric film formed on the first transparent dielectric film, and a third transparent dielectric film formed on the second transparent dielectric film. The first transparent dielectric film consists of aluminum dioxide ($Al_2O_3$). The second transparent dielectric film consists of titanium oxide ($TiO_2$) or tantalum pentoxide ($Ta_2O_5$), and the third transparent dielectric film consists of silicon dioxide ($SiO_2$). In this semiconductor laser, the following relationships are satisfied:

$$0.09\lambda \leq n1d1 \leq 0.15\lambda$$

$$0.20\lambda \leq n2d2 \leq 0.22\lambda$$

$$0.225\lambda \leq n3d3 \leq 0.245\lambda$$

where $\lambda$ is the oscillating wavelength, n1, n2, and n3 are the refractive indices of the first, second, and third dielectric films with respect to the oscillating wavelength, and d1, d2, and d3 are the thicknesses of the first, second, and third dielectric films.

15 Claims, 4 Drawing Sheets

RATIO OF REFRACTIVE INDEX × THICKNESS
(OPTICAL LENGTH) TO WAVELENGTH λ

SEMICONDUCTOR LASER

BACKGROUND OF THE INVENTION

1. Field of the Invention

The present invention relates to a semiconductor laser, and more particularly to a semiconductor laser with an improved dielectric film formed on an end (front or rear) facet through which oscillating light passes.

2. Description of the Related Art

If a semiconductor laser is operated with the facets of the semiconductor crystal exposed, the semiconductor crystal facets will be oxidized and therefore the semiconductor laser will be gradually deteriorated. To prevent this problem, it is known, as shown in Japanese Unexamined Patent Publication No. 6(1994)-112679, for instance, that a transparent single-layer dielectric film, which consists of aluminum oxide ($Al_2O_3$), etc., is formed on an end facet of a semiconductor laser through which oscillating light passes.

In the case of such a dielectric film, the reflectance of the laser end facet varies with the thickness of the dielectric film. An example of the change characteristic of the reflectance is shown in FIG. 7. Hence, it becomes possible to set the reflectance of the laser end facet to a desired value by controlling the film thickness. Note that in FIG. 7 the axis of abscissas represents a ratio of optical length (refractive index×thickness) to wavelength $\lambda$, not the film thickness itself.

As is well known in prior art, if in semiconductor lasers the oscillating light emitted therefrom is reflected at the facets, etc., of other optical components and incident again as return light, the oscillation will become unstable, causing problems of noise, etc. To prevent problems with return light, setting the reflectance of the end facet of the semiconductor laser relatively low (in the order of 10 to 25%) is effective. For this purpose, a method of controlling the thickness of the above-mentioned dielectric film can be applied.

However, in the case where the above-mentioned single-layer dielectric film is formed on the laser end facet, it is considerably difficult to accurately set the reflectance of the laser end facet to a desired value, because, as is seen from FIG. 7, the reflectance of the end facet varies sharply with a change in the film thickness.

On the other hand, a curved line b of FIG. 6 shows a wavelength dispersion example of the reflectance of the end facet of a semiconductor laser with a single-layer $Al_2O_3$ film formed. As illustrated in the figure, the reflectance of the laser end facet varies sharply with a change in the wavelength. In many cases, semiconductor lasers in a certain oscillating wavelength band (e.g., 700 to 1100 nm, etc.) are fabricated by common processing. However, if the wavelength dispersion of the reflectance of the laser end facet is great as described above, semiconductor lasers that can be fabricated by common processing will be restricted to a considerably narrow oscillating wavelength band.

SUMMARY OF THE INVENTION

The present invention has been made in view of the above-mentioned circumstances. Accordingly, it is the primary object of the present invention to provide a semiconductor laser which is capable of minimizing a change in the reflectance of an end facet, through which oscillating light passes, with respect to changes in the refractive index and thickness of a dielectric film formed on the end facet, and accurately setting the reflectance of the end facet to a desired value.

To achieve this end and in accordance with an important aspect of the present invention, there is provided a semiconductor laser comprising: a first transparent dielectric film formed on at least either a front or rear facet through which oscillating light passes; a second transparent dielectric film formed on the first transparent dielectric film; and a third transparent dielectric film formed on the second transparent dielectric film; wherein the following relationships are satisfied:

$$0.09\lambda \leq n1d1 \leq 0.15\lambda$$

$$0.20\lambda \leq n2d2 \leq 0.22\lambda$$

$$0.225\lambda \leq n3d3 \leq 0.245\lambda$$

$$1.58 \leq n1 \leq 1.64$$

$$2.0 \leq n2 \leq 2.4$$

$$1.44 \leq n3 \leq 1.46$$

where $\lambda$ is the oscillating wavelength, n1, n2, and n3 are the refractive indices of the first, second, and third dielectric films with respect to the oscillating wavelength, and d1, d2, and d3 are the thicknesses of the first, second, and third dielectric films.

For example, aluminum oxide ($Al_2O_3$), titanium dioxide ($TiO_2$), tantalum pentoxide ($Ta_2O_5$), and silicon dioxide ($SiO_2$), which will be described later, are known as transparent dielectrics that are transparent to oscillating light emitted from a general semiconductor laser. In the present invention, the dielectric film materials are not limited to these. For instance, this invention is capable of employing a material containing aluminum (Al) and oxygen (o) and ranging from 1.58 to 1.64 in refractive index, a material containing titanium (Ti) and oxygen (o) and ranging from 2.2 to 2.4 in refractive index, a material containing titanium (Ta) and oxygen (o) and ranging from 2.0 to 2.2 in refractive index, and a material containing silicon (Si) and oxygen (o) and ranging from 1.44 to 1.46 in refractive index.

In accordance with another important aspect of the present invention, there is provided a semiconductor laser comprising: a first transparent dielectric film formed on at least either a front or rear facet through which oscillating light passes, the first transparent dielectric film consisting of aluminum oxide ($Al_2O_3$); a second transparent dielectric film formed on the first transparent dielectric film, the second transparent dielectric film consisting of titanium dioxide ($TiO_2$) or tantalum pentoxide ($Ta_2O_5$); and a third transparent dielectric film formed on the second transparent dielectric film, the third transparent dielectric film consisting of silicon dioxide ($SiO_2$); wherein the following relationships are satisfied:

$$0.09\lambda \leq n1d1 \leq 0.15\lambda$$

$$0.20\lambda \leq n2d2 \leq 0.22\lambda$$

$$0.225\lambda \leq n3d3 \leq 0.245\lambda$$

where $\lambda$ is the oscillating wavelength, n1, n2, and n3 are the refractive indices of the first, second, and third dielectric films with respect to the oscillating wavelength, and d1, d2, and d3 are the thicknesses of the first, second, and third dielectric films.

The refractive index n1 of $Al_2O_3$ ranges between 1.58 and 1.64, the refractive index n2 of $TiO_2$ ranges between 2.0 and 2.4, the refractive index n2 of $Ta_2O_5$ ranges between 2.0 and 2.2, and the refractive index n3 of $SiO_2$ ranges between 1.44 and 1.46.

Note that the aforementioned construction is particularly effective when applied to the case where the reflectance of the laser end facet is set relatively low (in the order of 10 to 25%) to eliminate the aforementioned problems with return light.

Reducing a change in the reflectance of the laser end facet with respect to changes in the refractive index and thickness of the dielectric film is equivalent to reducing reflectance distribution by wavelength, for the following reasons. From this fact it follows that if a dielectric film consisting of layers having a small change in the reflectance with respect to wavelength change is formed on the laser end facet, the object of the present invention is to be achieved.

Since there is a relationship of $nd=\lambda/4$ between the refractive index n and thickness d of a single-layer dielectric film and the wavelength $\lambda$ of light at which the reflectance is the lowest, the following relationship is established:

$$(n+\delta n)(d+\delta d)=(\lambda+\delta\lambda)/4$$

in which $\delta n$ is a variation in the refractive index n, $\delta d$ is a variation in the thickness d, and $\delta\lambda$ is a change in the wavelength $\lambda$. From this fact, if the layer construction of a dielectric film is formed so that the reflectances at wavelengths $\lambda$ and $(\lambda+\delta\lambda)$ are much the same, essentially the same reflectances can be obtained within the variation $\delta n$ in the refractive index and the variation $\delta d$ in the thickness. Thus, the object of the present invention can be achieved if a dielectric film, consisting of layers in which a change in reflectance distribution with respect to wavelength change is small, is formed on the laser end facet.

The above-mentioned three-layer dielectric film, constructed of the first dielectric film consisting of $Al_2O_3$, the second dielectric film consisting of $TiO_2$ or $Ta_2O_5$, and the third dielectric film consisting of $SiO_2$, which satisfies $0.09\lambda \leq n1\ d1 \leq 0.15\lambda$, $0.20\lambda \leq n2\ d2 \leq 0.22\lambda$, and $0.225\lambda \leq n3\ d3 \leq 0.245\lambda$, is clearly smaller in reflectance change with respect to wavelength change, compared with the conventional single-layer dielectric film (curved line b), as shown by a curved line a in FIG. 6.

The aforemenionted semiconductor laser, in which the materials of the first, second, and third dielectric films are not prescribed, is also capable of obtaining the same advantages as the aforementioned, because the refractive-index ranges of the first second, and third dielectric films are the same as the refractive-index range 1.58 to 1.64 of $Al_2O_3$, the refractive-index range 2.0 to 2.4 of $TiO_2$ or $Ta_2O_5$, and the refractive-index range 1.44 to 1.46 of $SiO_2$, respectively.

Therefore, the semiconductor laser of the present invention with such a three-layer dielectric film on the end facet is capable of minimizing a change in the reflectance of the end facet with respect to changes in the refractive index and thickness of the dielectric film, and accurately setting the reflectance of the end facet to a desired value, i.e., a value within the range of 10 to 25% required for eliminating problems associated with return light.

More specifically, as described later, even if the oscillating wavelength varies between ±150 nm, reflectance within the range of 10 to 25% can be set to a desired value with an error range of ±1.5% (about 2% even in the case of leaving a margin). Thus, the semiconductor laser according to the present invention is capable of greatly enhancing its reproducibility, as it can be fabricated by a common end-facet coating process even when the oscillating wavelength varies within about 300 nm.

In addition, from the aforementioned relationship of $(n+\delta n)(d+\delta d)=(\lambda+\delta\lambda)/4$, when the above-mentioned three-layer dielectric film is virtually taken to be a single-layer film, the refractive index and thickness of this film are taken to be n' and d', and, as described above, the oscillating wavelength varies between ±150 nm, it can be safely stated that in a range where a value of $(d'\delta n'+n'\delta d'+\delta n'\delta d')$ becomes 37.5 nm (=150 nm/4), it is possible to suppress a change in the reflectance with respect to variations in the refractive index and thickness of the dielectric film to ±1.5% (about 2% even in the case of leaving a margin).

BRIEF DESCRIPTION OF THE DRAWINGS

The present invention will be described in further detail with reference to the accompanying drawings wherein.

DESCRIPTION OF THE PREFERRED EMBODIMENTS

Figure 1:
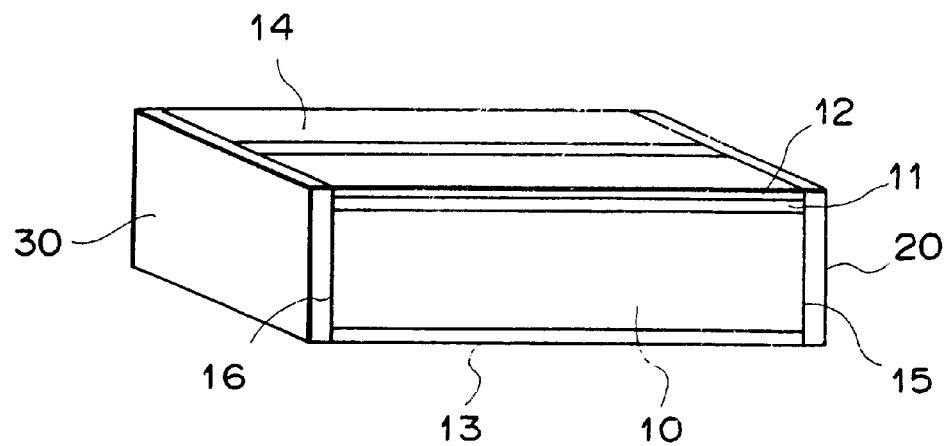
FIG. 1 is a perspective view showing a semiconductor laser according to a first embodiment of the present invention.

Referring to FIG. 1, there is shown a semiconductor laser in accordance with a first embodiment of the present invention. This semiconductor laser has (1) a substrate 10 which consists, for example, of GaAs, (2) an epitaxial multilayer film 11 formed on the substrate 10, (3) a current strangulating layer 12 which consists of $SiO_2$, SiN, or the like, (4) an N-electrode 13, formed on the side of the substrate 10, which consists of a metal multilayer film, etc., and (5) a P-electrode 14, formed on the opposite side, which consists of a metal multilayer film, etc.

On a front facet 15 and a rear facet 16, which constitute resonator facets, dielectric multilayer films 20 and 30 for preventing oxidization of the end facet and also controlling the reflectance of the end facet, as described previously, are formed. In the first embodiment, the dielectric multilayer film 30 on the rear facet 16 is a multilayer film in which high reflectance is obtained, while the dielectric film 20 of the front facet 15 having the possibility of the incidence of return light is a three-layer dielectric film which can set its reflectance to a value within a range of 10 to 25% (in the first embodiment, 13%).

Note that the present invention is not always applied to the dielectric film on the front facet 15. For example, when it is desired to set the reflectance of the rear facet 16 relatively low, the dielectric film on this rear facet 16 may be the three-layer structure according to the present invention.

Furthermore, the three-layer dielectric film may be a single-layer dielectric film.

Figure 2:
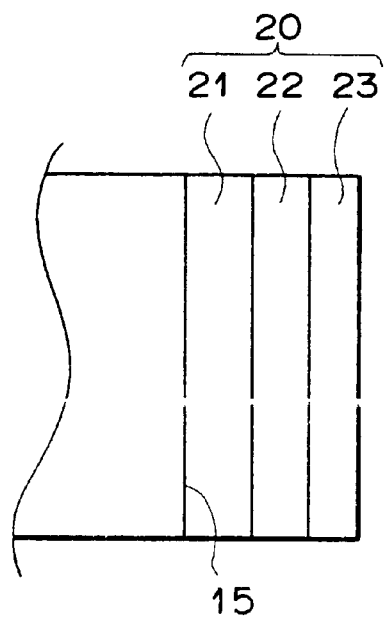
FIG. 2 is an enlarged side view showing the essential part of the semiconductor laser.

In the first embodiment, the reflectance of the front facet 15 is set to 13% at an oscillating wavelength of $\lambda$=800 nm. For this purpose, the dielectric multilayer film 20, as shown in FIG. 2, is constructed of three layers: a first dielectric film 21, formed on the front facet 15, which consists of $Al_2O_3$; a second dielectric film 22, formed on the first dielectric film 21, which consists of $TiO_2$; and a third dielectric film 23, formed on the second dielectric film 22, which consists of $SiO_2$.

The optical lengths (refractive index×thickness) of the first, second, and third dielectric films 21, 22, and 23 are n1d1=0.095$\lambda$, n2d2=0.20$\lambda$, and n3d3=0.235$\lambda$ in which n1, n2, and n3 are the refractive indices of the first, second, and third dielectric films 21, 22, and 23, and d1, d2, and d3 are the thicknesses of the first, second, and third dielectric films 21, 22, and 23. In this case, the refractive index n1 of $Al_2O_3$ is 1.60, the refractive index n2 of $TiO_2$ is 2.25, the refractive index n3 of $SiO_2$ is 1.45, and the refractive index n of the semiconductor laser itself is 3.4.

Figure 3:
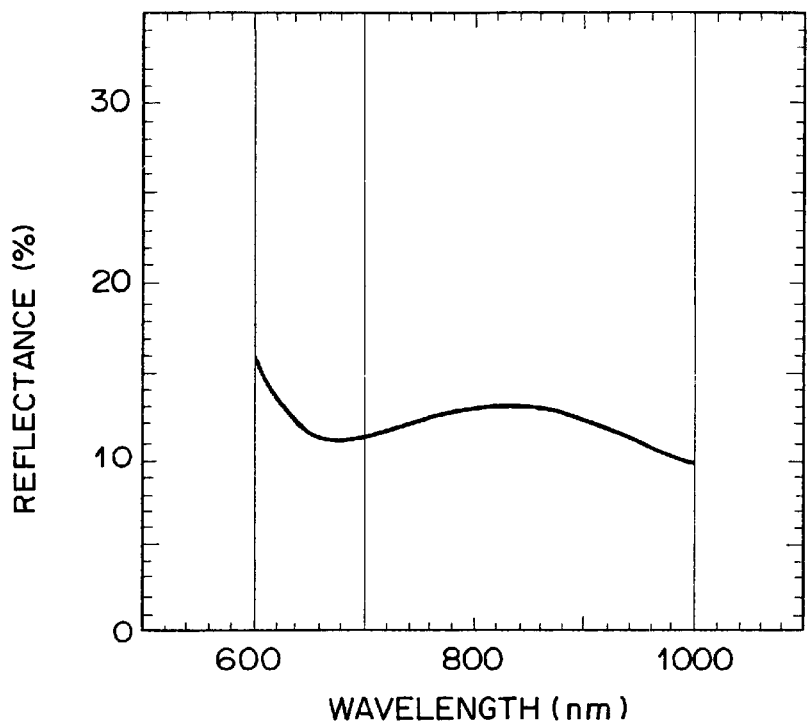
FIG. 3 is a graph showing the wavelength dispersion a characteristic of the reflectance of the end facet in the semiconductor laser of the first embodiment.

The wavelength dispersion characteristic of the reflectance of the front facet 15 in the first embodiment is shown in FIG. 3. As shown in the figure, the reflectance of the front facet 15 can be set to 13±1.5% at designed wavelength $\lambda$=800 nm±150 nm.

While, in the first embodiment, the first dielectric film 21, the second dielectric film 22, and the third dielectric film 23 are formed by vapor deposition, they may also be formed by sputter deposition, chemical vapor deposition, etc.

Now, a description will be given of a semiconductor laser according to a second embodiment of the present invention.

The semiconductor laser of the second embodiment will be described with FIGS. 1 and 2 because it is similar in basic configuration to the first embodiment. The same applies to a third embodiment to be described later.

In the second embodiment, the reflectance of the front facet 15 is set to 16% at an oscillating wavelength of $\lambda$=800 nm. For this purpose, the dielectric multilayer film 20, as shown in FIG. 2, is composed of three layers: a first dielectric film 21, formed on the front facet 15, which consists of $Al_2O_3$; a second dielectric film 22, formed on the first dielectric film 21, which consists of $TiO_2$; and a third dielectric film 23, formed on the second dielectric film 22, which consists of $SiO_2$.

The optical lengths (refractive index×thickness) of the first, second, and third dielectric films 21, 22, and 23 in the second embodiment are n1d1=0.12$\lambda$, n2d2=0.20$\lambda$, and n3d3=0.235$\lambda$ where n1, n2, and n3 are the refractive indices of the first, second, and third dielectric films 21, 22, and 23, and d1, d2, and d3 are the thicknesses of the first, second, and third dielectric films 21, 22, and 23. As with the first embodiment, the refractive index n1 of $Al_2O_3$ is 1.60, the refractive index n2 of $TiO_2$ is 2.25, the refractive index n3 of $SiO_2$ is 1.45, and the refractive index n of the semiconductor laser itself is 3.4.

Figure 4:
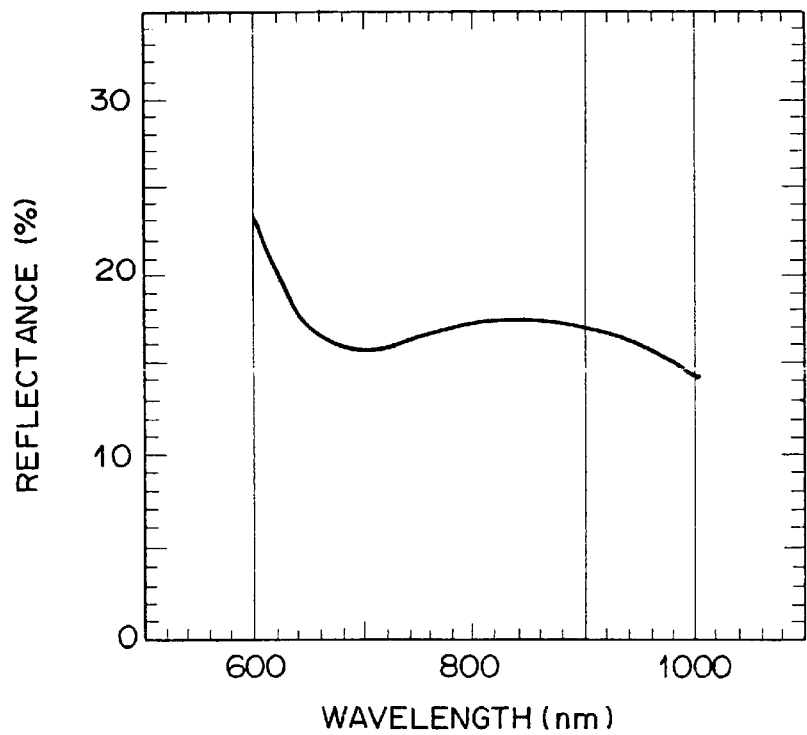
FIG. 4 is a graph showing the wavelength dispersion a characteristic of the reflectance of the end facet in a semiconductor laser of a second embodiment of the present invention.

The wavelength dispersion characteristic of the reflectance of the front facet 15 in the second embodiment is shown in FIG. 4. As shown in the figure, the reflectance of the front facet 15 can be set to 16±1.5% at designed wavelength $\lambda$=800 nm±150 nm.

Now, a description will be made of a semiconductor laser according to a third embodiment of the present invention. In this third embodiment, the reflectance of the front facet 15 is set to 20% at an oscillating wavelength of $\lambda$=800 nm. For this purpose, the dielectric multilayer film 20, as shown in FIG. 2, is made up of three layers: a first dielectric film 21, formed on the front facet 15, which consists of $Al_2O_3$; a second dielectric film 22, formed on the first dielectric film 21, which consists of $TiO_2$; and a third dielectric film 23, formed on the second dielectric film 22, which consists of $SiO_2$.

The optical lengths (refractive index×thickness) of the first, second, and third dielectric films 21, 22, and 23 in the third embodiment are n1d1=0.145$\lambda$, n2d2=0.20$\lambda$, and n3d3=0.235$\lambda$ where n1, n2, and n3 are the refractive indices of the first, second, and third dielectric films 21, 22, and 23, and d1, d2, and d3 are the thicknesses of the first, second, and third dielectric films 21, 22, and 23. As with the first embodiment, the refractive index n1 of $Al_2O_3$ is 1.60, the refractive index n2 of $TiO_2$ is 2.25, the refractive index n3 of $SiO_2$ is 1.45, and the refractive index n of the semiconductor laser itself is 3.4.

Figure 5:
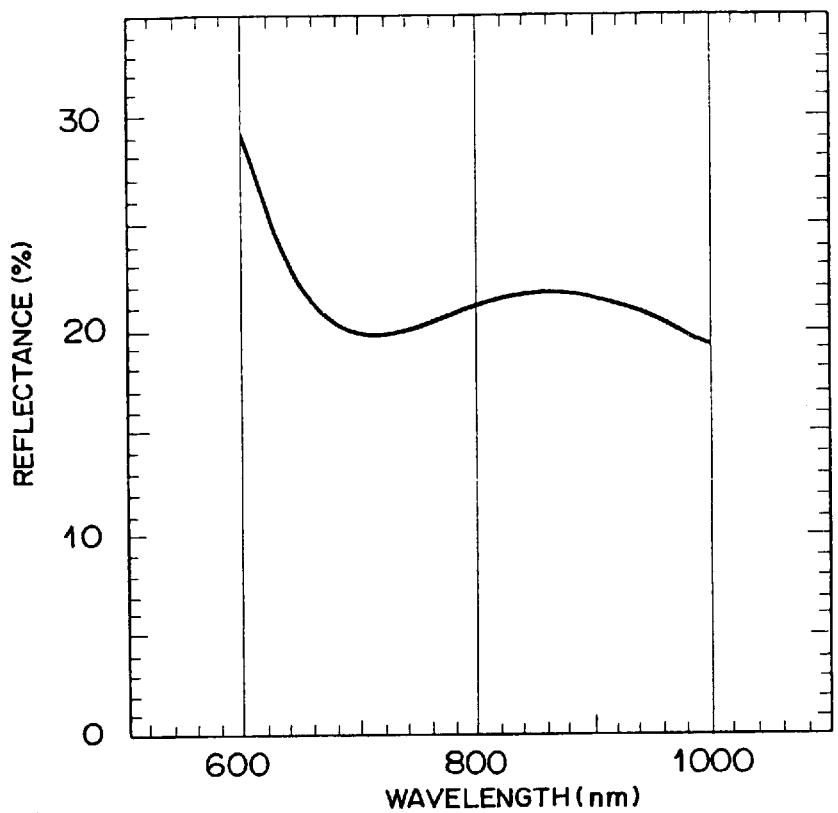
FIG. 5 is a graph showing the wavelength dispersion a characteristic of the reflectance of the end facet in a semiconductor laser of a third embodiment of the present invention.
Figure 6:
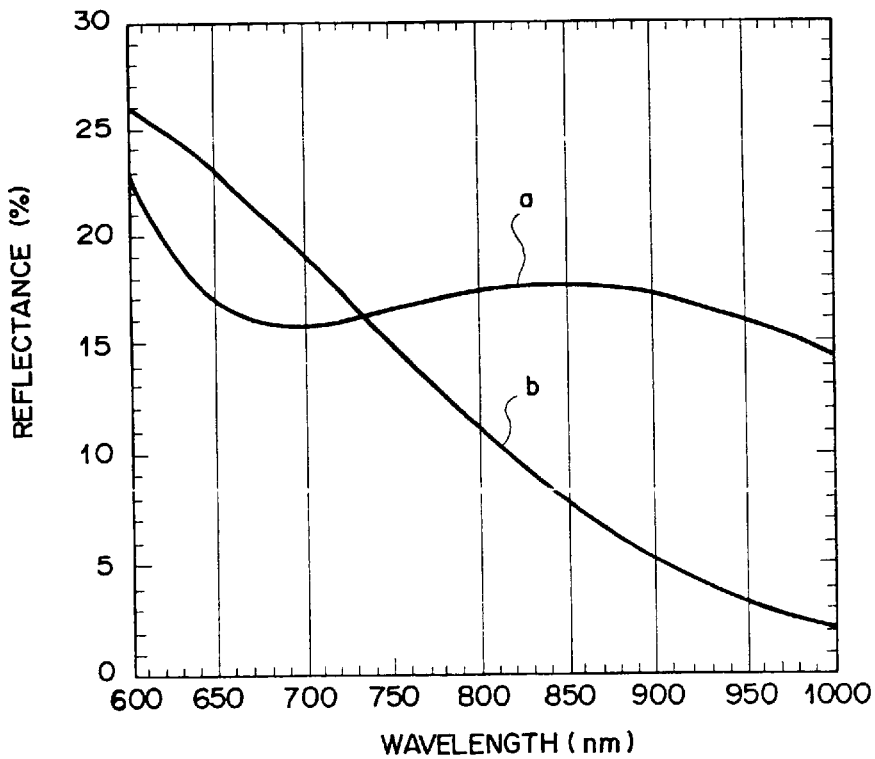
FIG. 6 is a graph showing comparison of the wavelength dispersion characteristics of the reflectances of the end facets in the semiconductor laser of the present invention and a conventional semiconductor laser.
Figure 7:
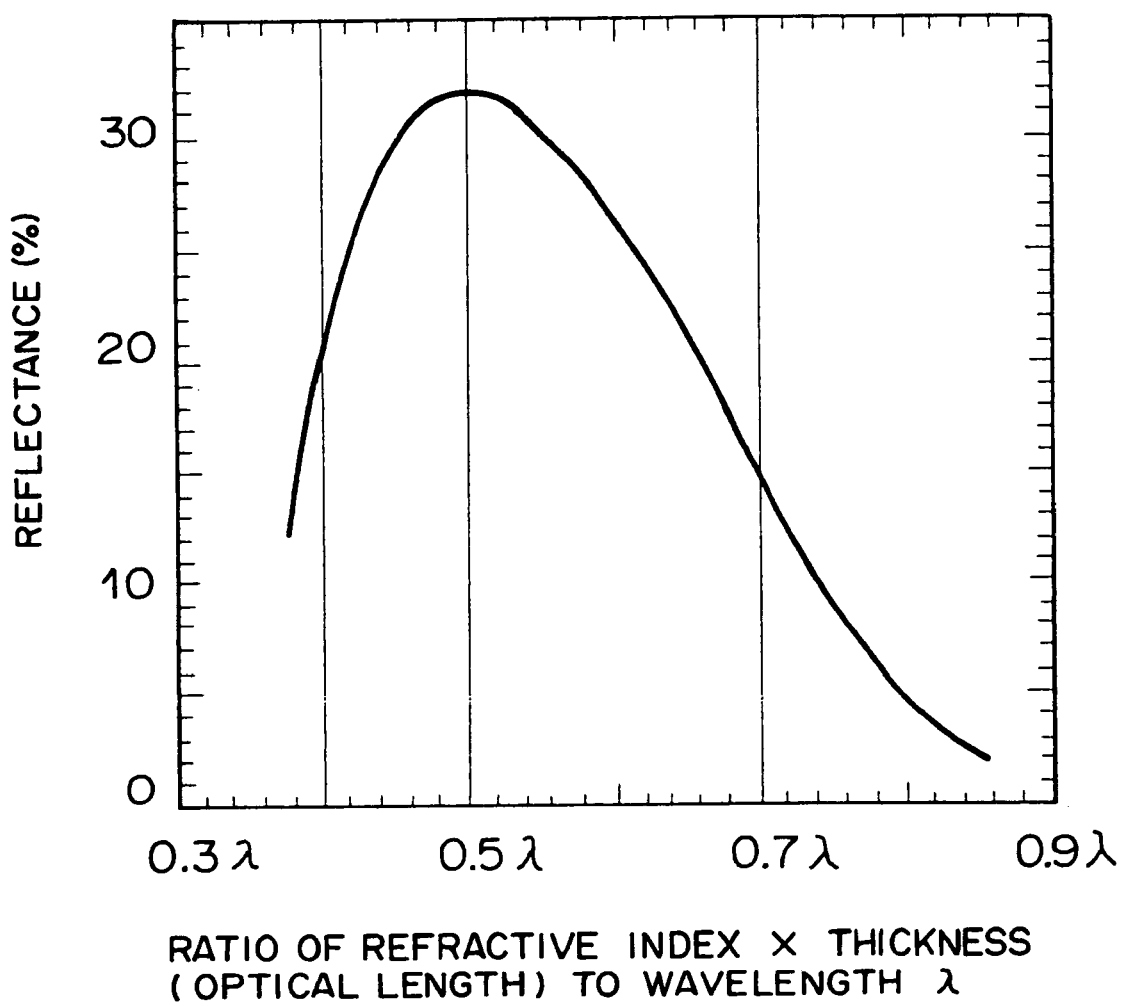
FIG. 7 is a graph showing a change in the reflectance of the laser end facet with respect to a change in the thickness of the dielectric layer in the conventional semiconductor laser.

The wavelength dispersion characteristic of the reflectance of the front facet 15 in the third embodiment is shown in FIG. 5. As shown in the figure, the reflectance of the front facet 15 can be set to 20±1.5% at designed wavelength $\lambda$=800 nm±150 nm.

While in the aforementioned three embodiments the second dielectric film 22 is formed from $TiO_2$, it may be formed from $Ta_2O_5$. Also, although in the embodiments the first dielectric film 21 is formed directly on the front facet 15, it may be formed the front facet 15 through another thin film.

In addition, all of the contents of Japanese Patent Application No. 11(1999)-295260 are incorporated into this specification by reference.

What is claimed is:

1. A semiconductor laser comprising:

a first transparent dielectric film formed on at least either a front or rear facet through which oscillating light passes;

a second transparent dielectric film formed on said first transparent dielectric film; and a third transparent dielectric film formed on said second transparent dielectric film;

wherein the following relationships are satisfied:

$$0.09\lambda \leq n1d1 \leq 0.15\lambda$$

$$0.20\lambda \leq n2d2 \leq 0.22\lambda$$

$$0.225\lambda \leq n3d3 \leq 0.245\lambda$$

$$1.58 \leq n1 \leq 1.64$$

$$2.0 \leq n2 \leq 2.4$$

$$1.44 \leq n3 \leq 1.46$$

where $\lambda$ is the oscillating wavelength, n1, n2, and n3 are the refractive indices of said first, second, and third dielectric films with respect to said oscillating wavelength, and d1, d2, and d3 are the thicknesses of said first, second, and third dielectric films.

2. The semiconductor laser as set forth in claim 1, wherein said facet ranges from 10 to 25% in reflectance.

3. The semiconductor laser of claim 2, wherein said reflectance is set with respect to the oscillating wavelength.

4. The semiconductor laser of claim 3, wherein the oscillating wavelength is 800±150 nm.

5. The semiconductor laser as set forth in claim 1, wherein said first transparent dielectric film is formed on said facet through another thin film.

6. A semiconductor laser comprising:
- a first transparent dielectric film formed on at least either a front or rear facet through which oscillating light passes, said first transparent dielectric film consisting of aluminum oxide ($Al_2O_3$);
- a second transparent dielectric film formed on said first transparent dielectric film, said second transparent dielectric film consisting of titanium dioxide ($TiO_2$); and
- a third transparent dielectric film formed on said second transparent dielectric film, said third transparent dielectric film consisting of silicon dioxide ($SiO_2$);

wherein the following relationships are satisfied:

$$0.09\lambda \leq n1d1 \leq 0.15\lambda$$

$$0.20\lambda \leq n2d2 \leq 0.22\lambda$$

$$0.225\lambda \leq n3d3 \leq 0.245\lambda$$

where $\lambda$ is the oscillating wavelength, n1, n2, and n3 are the refractive indices of said first, second, and third dielectric films with respect to said oscillating wavelength, and d1, d2, and d3 are the thicknesses of said first, second, and third dielectric films.

7. The semiconductor laser as set forth in claim 6, wherein said facet ranges from 10 to 25% in reflectance.

8. The semiconductor laser of claim 7, wherein said reflectance is set with respect to the oscillating wavelength.

9. The semiconductor laser of claim 8, wherein the oscillating wavelength is 800±150 nm.

10. The semiconductor laser as set forth in claim 6, wherein said first transparent dielectric film is formed on said facet through another thin film.

11. A semiconductor laser comprising:
- a first transparent dielectric film formed on at least either a front or rear facet through which oscillating light passes, said first transparent dielectric film consisting of aluminum oxide ($Al_2O_3$);
- a second transparent dielectric film formed on said first transparent dielectric film, said second transparent dielectric film consisting of tantalum pentoxide ($Ta_2O_5$); and
- a third transparent dielectric film formed on said second transparent dielectric film, said third transparent dielectric film consisting of silicon dioxide ($SiO_2$);

wherein the following relationships are satisfied:

$$0.09\lambda \leq n1d1 \leq 0.15\lambda$$

$$0.20\lambda \leq n2d2 \leq 0.22\lambda$$

$$0.225\lambda \leq n3d3 \leq 0.245\lambda$$

where $\lambda$ is the oscillating wavelength, n1, n2, and n3 are the refractive indices of said first, second, and third dielectric films with respect to said oscillating wavelength, and d1, d2, and d3 are the thicknesses of said first, second, and third dielectric films.

12. The semiconductor laser as set forth in claim 11, wherein said facet ranges from 10 to 25% in reflectance.

13. The semiconductor laser of claim 12, wherein said reflectance is set with respect to the oscillating wavelength.

14. The semiconductor laser of claim 13, wherein the oscillating wavelength is 800±150 nm.

15. The semiconductor laser as set forth in claim 11, wherein said first transparent dielectric film is formed on said facet through another thin film.

* * * * *